United States Patent
Glennan et al.

(10) Patent No.: US 9,978,722 B2
(45) Date of Patent: May 22, 2018

(54) INTEGRATED CIRCUIT PACKAGE ASSEMBLY WITH WIRE END ABOVE A TOPMOST COMPONENT

(71) Applicant: Intel Corporation, Santa Clara, CA (US)

(72) Inventors: William T. Glennan, Folsom, CA (US); Frank D. Madrigal, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/280,860

(22) Filed: Sep. 29, 2016

(65) Prior Publication Data

US 2018/0090468 A1    Mar. 29, 2018

(51) Int. Cl.
*H01L 25/065* (2006.01)
*H01L 23/31* (2006.01)
(Continued)

(52) U.S. Cl.
CPC ........ *H01L 25/0657* (2013.01); *H01L 21/565* (2013.01); *H01L 22/32* (2013.01);
(Continued)

(58) Field of Classification Search
CPC . H01L 25/0657; H01L 23/3128; H01L 24/49; H01L 24/05; H01L 23/49838; H01L 24/85; H01L 21/565; H01L 25/50; H01L 25/18; H01L 22/32; H01L 2224/48106; H01L 2924/1436; H01L 2924/19042; H01L 2924/19105; H01L 2225/06575;
(Continued)

(56) References Cited

U.S. PATENT DOCUMENTS

| 6,759,311 B2 * | 7/2004 | Eldridge ............. H01L 21/6836 257/E21.237 |
| 8,664,757 B2 | 3/2014 | Cho et al. |

(Continued)

FOREIGN PATENT DOCUMENTS

JP    2007123595 A    5/2007

OTHER PUBLICATIONS

International Search Report and Written Opinion dated Jan. 26, 2018 for PCT/US2017/049157, 13 pages.

*Primary Examiner* — Kyoung Lee
(74) *Attorney, Agent, or Firm* — Schwabe, Williamson & Wyatt, P.C.

(57) ABSTRACT

Embodiments of the present disclosure describe integrated circuit (IC) package assemblies having one or more wires that extend beyond a topmost component in the IC package assembly, computing devices incorporating the IC package assemblies, methods for formation of the IC package assemblies, and associated configurations. An IC package assembly may include a substrate having a first side and a second side opposite the first side, an IC die having a first side and a second side opposite the first side, where the first side of the IC die faces the first side of the substrate, a wire electrically coupled with the IC die, where an end of the wire extends beyond a topmost component in the IC package assembly, and an overmold coupled with the topmost component. Other embodiments may be described and/or claimed.

25 Claims, 5 Drawing Sheets

(51) Int. Cl.
*H01L 23/00* (2006.01)
*H01L 23/498* (2006.01)
*H01L 21/56* (2006.01)
*H01L 25/00* (2006.01)
*H01L 25/18* (2006.01)
*H01L 21/66* (2006.01)

(52) U.S. Cl.
CPC .... *H01L 23/3128* (2013.01); *H01L 23/49838* (2013.01); *H01L 24/05* (2013.01); *H01L 24/49* (2013.01); *H01L 24/85* (2013.01); *H01L 25/18* (2013.01); *H01L 25/50* (2013.01); *H01L 2224/04042* (2013.01); *H01L 2224/32225* (2013.01); *H01L 2224/432* (2013.01); *H01L 2224/48091* (2013.01); *H01L 2224/48106* (2013.01); *H01L 2224/48147* (2013.01); *H01L 2224/48227* (2013.01); *H01L 2224/73265* (2013.01); *H01L 2225/0651* (2013.01); *H01L 2225/06506* (2013.01); *H01L 2225/06555* (2013.01); *H01L 2225/06575* (2013.01); *H01L 2225/06596* (2013.01); *H01L 2924/1433* (2013.01); *H01L 2924/1436* (2013.01); *H01L 2924/1443* (2013.01); *H01L 2924/15311* (2013.01); *H01L 2924/19042* (2013.01); *H01L 2924/19105* (2013.01)

(58) Field of Classification Search
CPC ... H01L 2225/0651; H01L 2225/06555; H01L 2924/15311; H01L 2224/48091; H01L 2924/1433; H01L 2224/48227; H01L 2224/32225; H01L 2224/73265; H01L 2224/48147; H01L 2224/04042; H01L 2224/432; H01L 2924/1443; H01L 2225/06596; H01L 2225/06506
See application file for complete search history.

(56) References Cited

U.S. PATENT DOCUMENTS

| | | |
|---|---|---|
| 9,349,706 B2 | 5/2016 | Co et al. |
| 2009/0184410 A1 | 7/2009 | Park et al. |
| 2014/0362629 A1 | 12/2014 | Crisp et al. |

* cited by examiner

INTEGRATED CIRCUIT PACKAGE ASSEMBLY WITH WIRE END ABOVE A TOPMOST COMPONENT

TECHNICAL FIELD

The present disclosure relates generally to the field of packages for electronic devices, and more specifically to power delivery and signal integrity test access for electronic devices in packages.

BACKGROUND

Existing solutions that provide access to bond wires and silicon pads for testing an integrated circuit (IC) package assembly typically involve chemicals to dissolve the mold compound of the IC package assembly using a jet etch process. This process is limited in depth and the quantity of material that can be removed. If too aggressive, bond wires and other metal may be etched or dissolved as well, rendering the component non-functional. Additionally, once exposed, the probe sites may be deformed or difficult to access with a probe.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
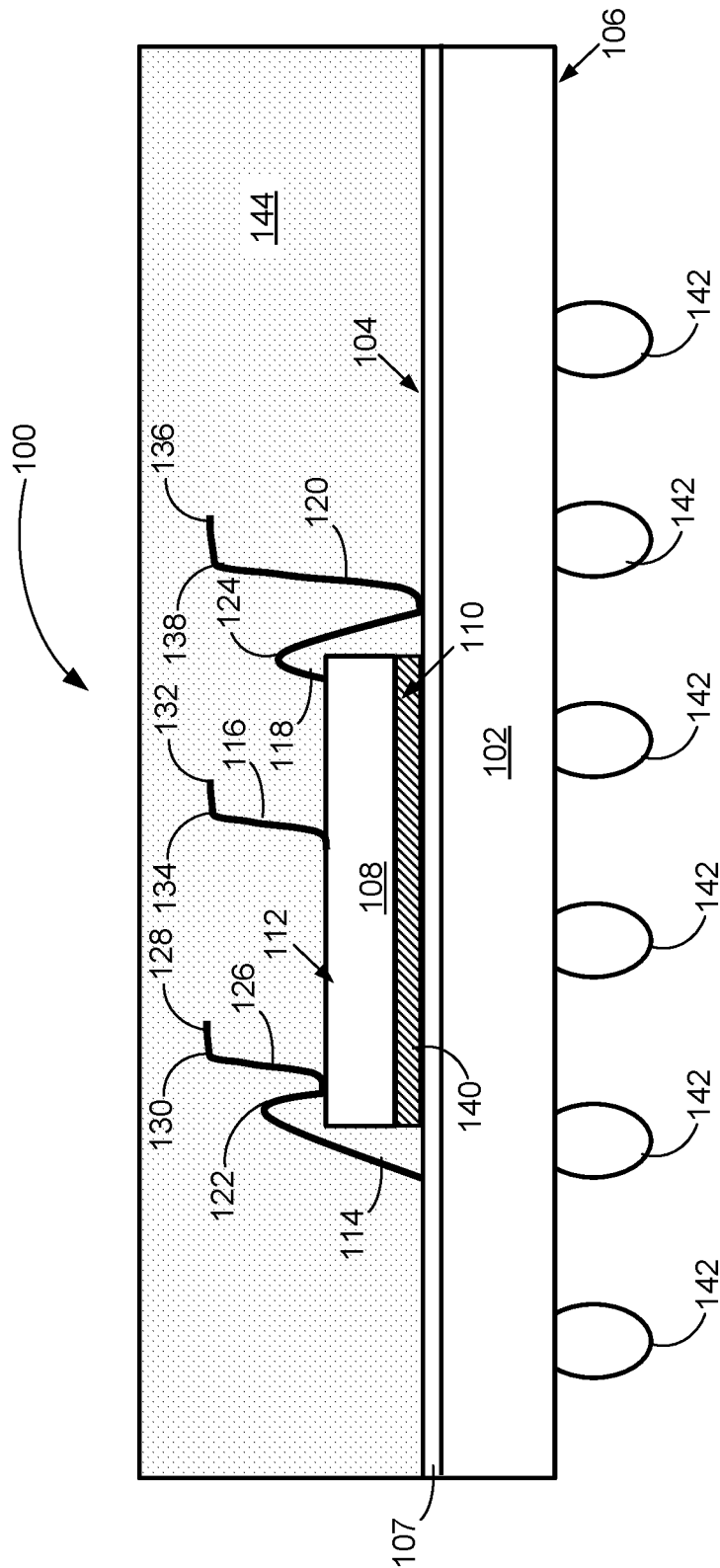
FIG. 1 schematically illustrates a cross-sectional side view of an integrated circuit (IC) package assembly that may include one or more wires extending beyond a topmost component in the IC package assembly, in accordance with various embodiments.

Embodiments herein may include integrated circuit (IC) package assemblies having one or more wires extending beyond a topmost component in the IC package assembly, computing devices incorporating the IC package assemblies, methods for formation of the IC package assemblies, and associated configurations. An IC package assembly may include a substrate having a first side and a second side opposite the first side, an IC die having a first side and a second side opposite the first side, where the first side of the IC die faces the first side of the substrate, a wire electrically coupled with the IC die, where an end of the wire extends beyond a topmost component in the IC package assembly, and an overmold coupled with the topmost component.

Some embodiments may include an IC package assembly with simplified exposure of test points for landing probes on critical signals or power circuits to allow visibility and verification of electrical performance within the molded package. In various embodiments, one or more wirebonds within the package may be extended vertically beyond the highest component in the package. After molding, a portion of the mold compound may be removed or sanded to expose the end of the wirebond and allow probe attach without risking silicon, wirebond, or substrate exposure and damage. In some embodiments, the need for jet etching may be removed entirely. Rather than digging down into the chip with a jet etching process to access critical signals, various embodiments may bring the critical signals to a point just below the package surface where they may be exposed for testing after removal of a portion of an overmold.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

FIG. 1 schematically illustrates a cross-sectional side view of an IC package assembly 100, in accordance with some embodiments. In various embodiments, the IC package assembly 100 may include a substrate 102 having a first side 104 and a second side 106 opposite the first side 104. In some embodiments, the substrate 102 may include a redistribution layer 107. In various embodiments, the substrate 102 may include additional layers, not shown for clarity, and/or may not include the redistribution layer 107. In some embodiments, the IC package assembly 100 may also include an IC die 108 having a first side 110 and a second side 112 opposite the first side 110, where the first side 110 of the IC die 108 faces the first side 104 of the substrate 102. In various embodiments, the IC die 108 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the IC die 108 may be, include, or be a part of a radio frequency (RF) die. In other embodiments, the die may be, include, or be a part of a processor, memory, system-on-chip (SoC), or application specific integrated circuit (ASIC).

In some embodiments, the IC die 108 may generally include a semiconductor substrate, one or more device layers, and one or more interconnect layers. The semiconductor substrate may be substantially composed of a bulk semiconductor material such as, for example, silicon, in some embodiments. The device layer may represent a region where active devices such as transistor devices are formed on the semiconductor substrate. The device layer may include, for example, structures such as channel bodies and/or source/drain regions of transistor devices. The interconnect layer may include interconnect structures that are configured to route electrical signals to or from the active devices in the device layer. For example, the interconnect layer may include trenches and/or vias to provide electrical routing and/or contacts. In some embodiments, one or more electrically functional through-silicon vias (TSVs) (not shown) may extend through the interconnect layer, the device layer, and the semiconductor substrate such that additional circuitry (not shown) and/or dies (not shown) may be coupled with an inactive side of the IC die 108. In some embodiments, the die-level interconnect structures may be configured to route electrical signals between the IC die 108 and other electrical devices. The electrical signals may include, for example, input/output (I/O) signals and/or power/ground signals that are used in connection with operation of the IC die 108.

In some embodiments, the IC package assembly 100 may include additional electrical routing features, not shown for clarity, such as for example, traces, pads, through-holes, vias, or lines configured to route electrical signals to or from the IC die 108. For example, the package assembly 100 may be configured to route electrical signals between the IC die 108 and components for wireless communication that may be integrated within the package assembly, or between the IC die 108 and the substrate 102, or between the IC die 108 and another electrical component (e.g., another die, interposer, interface, component for wireless communication, etc.) coupled with the IC package assembly 100.

In various embodiments, a first wire 114 may be wire bonded to the substrate 102 and the die 108, a second wire 116 may be electrically coupled with the die 108, a third wire 118 may be electrically coupled with the IC die 108 and the substrate 102, and a fourth wire 120 may be electrically coupled with the third wire 118 at the substrate 102. In some embodiments, one or more of the wires may be bonded with a die pad on the IC die 108 and/or with a pad on the substrate 102, pads not shown for clarity. In various embodiments the first wire 114 may include a highest point 122 along the first wire 114 between the IC die 108 and a lower layer such as the substrate 102 and the third wire 118 may include a highest point 124 along the third wire 118 between the IC die 108 and a lower layer such as the substrate 102.

In some embodiments, the first wire 114 may include a portion 126 that extends upward beyond the IC die 108. In embodiments, the relative directions upward and/or above may refer to a direction from the first side 110 to the second side 112 of the die 108 away from the substrate 102, although it should be understood that the overall orientation of the IC package assembly 100 may be in any direction with respect to another reference frame such as an earth centered coordinate system. In various embodiments, an end 128 of the first wire 114 may extend above a topmost component in the IC package assembly 100. In the embodiment shown, the IC die 108 is the topmost component. In various embodiments, the end 128 may also extend above a highest point of any wires and/or portions of wires coupled with lower layers such as the substrate 102 (e.g., highest point 122 of first wire 114 and highest point 124 of third wire 120) that are not testing wires. In some embodiments, one or more bond wires may be extended directly from the substrate 102, such as when access to power planes or other circuitry residing at that lower layer in the IC package assembly 100 is desired. In various embodiments, the second wire 116 and the fourth wire 120 may be testing wires and the portion 126 of the first wire 114 may be considered to be a testing wire, while a portion of the first wire 114 that includes the highest point 122 of the first wire coupled with the substrate 102 may not be considered to be a testing wire in some embodiments. In some embodiments, testing wires in the IC package assembly 100 may extend beyond a topmost component in the IC package assembly 100 and/or beyond the highest point of any non-testing wires. In various embodiments where wires may be considered to be components in the IC package assembly 100, the topmost component may be the component in the IC package assembly 100 having a surface located the farthest from the substrate 102 of any components other than testing wires in the IC package assembly 100 such that the testing wires may extend above the highest point of non-testing wires and/or components such as dies and/or inductors.

In some embodiments, the first wire 114 may be bent at a position 130 above the topmost component and the highest point of any wires, or portions of wires, coupled with lower layers (e.g., non-testing wires). In some embodiments, the second wire 116 may not be electrically coupled with lower layers such as the substrate 102. In various embodiments, an end 132 of the second wire 122 may extend above the topmost component and/or the highest point of any wires coupled with lower layers. In some embodiments, the second wire 116 may be bent at a position 134 above the topmost component and the highest point of any wires coupled with lower layers. In some embodiments, an end 136 of the fourth wire 120 may extend above the topmost component and/or the highest point of any wires and/or portions of wires coupled with lower layers such as the substrate 102 (e.g., highest point 122 and 124). In various embodiments, the fourth wire 120 may be bent at a position 138 above the topmost component and the highest point of any wires coupled with lower layers. In some embodiments, the first wire 114, the second wire 116, and/or the fourth wire 120 may be bent in a horizontal direction relative to the upward direction from the substrate 102 toward a top of the IC package assembly 100. In some embodiments, one or more of the positions (e.g., 130, 134, 138) at which the wires are bent may start below the topmost component and/or the highest points (e.g., 122, 124) of any wires coupled with lower layers, with the end (e.g., 128, 132, 136) of the wire still being above the topmost component and the highest points of any wires coupled with lower layers.

In some embodiments, a die attach layer 140 may be between the IC die 108 and the substrate 102. In various embodiments, the die attach layer 140 may be an adhesive and/or an insulator. In some embodiments, the die attach layer 140 may not be present and the IC die 108 may be directly coupled with the substrate 102. In some embodiments, the IC package assembly 100 may include one or more interconnects 142, that may be solder balls or other interconnect structures in various embodiments. In embodiments, the interconnects 142 may be electrically coupled with one or more pads on the first side 104 of the substrate 102 such as by using connecting structures (e.g., vias) between the interconnects 142 and the first side 104. The pads and connecting structures are not shown in FIG. 1 for clarity. The interconnects 142 may be arranged in a regular pattern such as a ball grid array (BGA) in various embodiments. In embodiments, one or more wires electrically coupled with the IC die 108 and the substrate 102 may be electrically coupled with one or more of the one or more interconnects 142. In various embodiments, any other type of suitable die attach technique, packaging technique, or interconnect configuration may be used (e.g., leads, flip chip, land grid array (LGA)).

In various embodiments, an overmold 144 may encapsulate the IC die 108 and the wires 114, 116, 118, and 120. In some embodiments, a perforated isolation material, not shown for clarity, may be slipped between the wires 116, 120, and portion 126 of wire 114 so that they do not get bent or pushed into one another during the mold flow process. In embodiments where the perforated isolation material is used, the bends of the wires may be oriented in a common direction to allow the perforated isolation material to more easily slip over and between the wires. In some embodiments, the overmold 144 may be formed of a molding compound or other suitable material. In other embodiments, an encapsulating cover other than an overmold may be used. In various embodiments, the ends of the wires (e.g., 128, 134, 136) may extend above the topmost component in the IC package assembly 100 and above the highest points of portions of wires extending from dies in the IC package assembly to lower points in the IC package assembly (e.g., 122, 124) so the ends of the wires can be exposed for testing by removing a portion of the overmold 144. In some embodiments, the ends of the wires (e.g., 128, 134, 136) may be bent horizontally to expose a greater wire area when the portion of the overmold 144 is removed.

The IC package assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the IC die 108 and other components of the IC package assembly 100 may be used in some embodiments.

In some embodiments, one or more additional dies may be included in the IC package assembly 100. The additional dies may include IC dies such as memory dies and/or radio frequency (RF) communication dies in various embodiments. The additional dies may include sensors, gyroscopes, a geographic positioning system (GPS), and/or other system elements.

Figure 2:
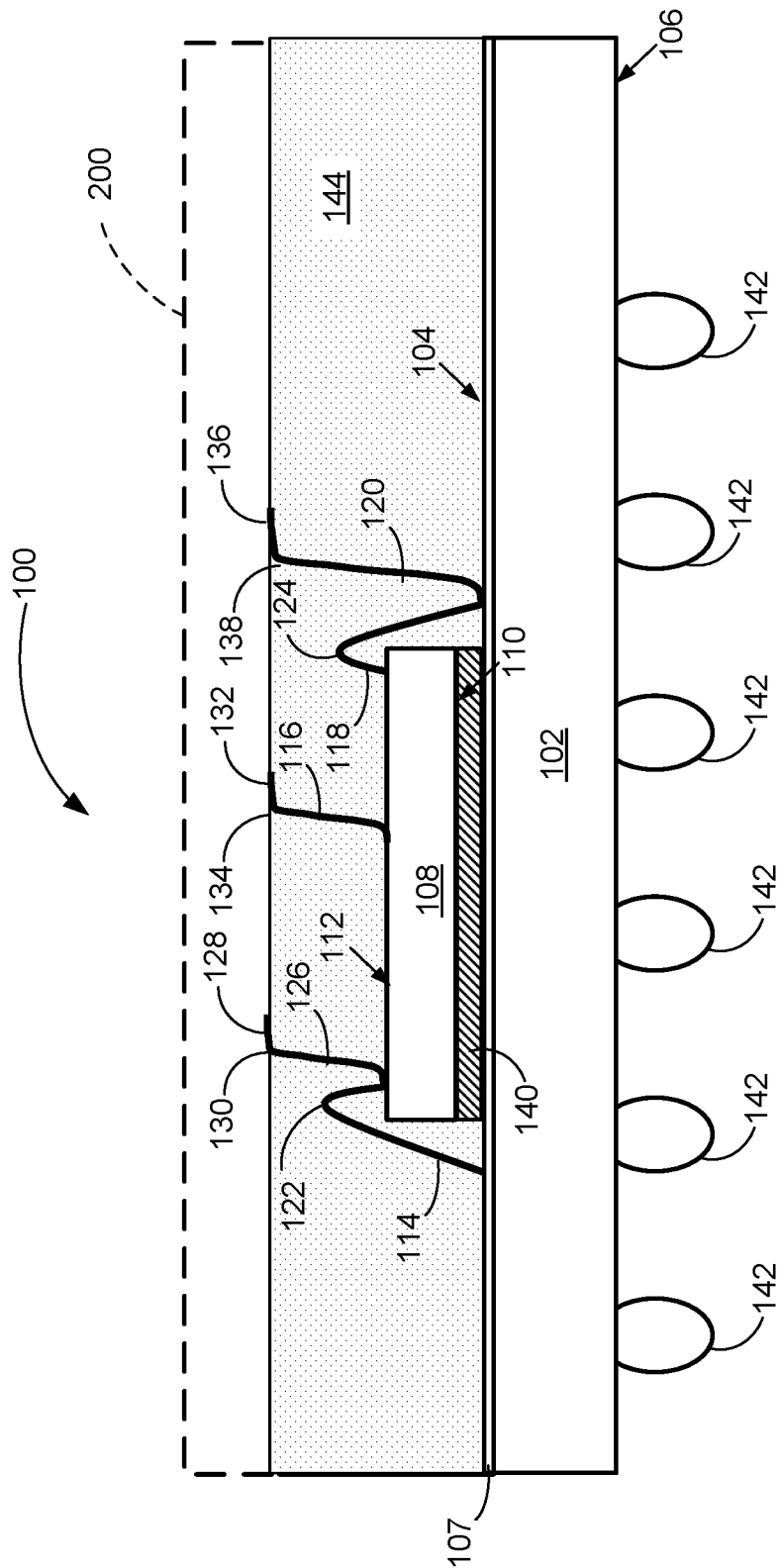
FIG. 2 schematically illustrates a cross-sectional side view of an IC package assembly having a top portion removed to expose one or more wires, in accordance with various embodiments.

FIG. 2 schematically illustrates a cross-sectional side view of the IC package assembly 100 after a top portion 200 of the overmold 144 has been removed, in accordance with some embodiments. In various embodiments, the top portion 200 may be removed by a process such as grinding or sanding to expose the end 128 of the first wire 114, the end 132 of the second wire 116, and the end 136 of the fourth wire 120. In some embodiments, exposing the ends of the wires may allow probe attach without risking silicon, wirebond, or substrate exposure and/or damage. Although the ends of the wires are shown as protruding slightly above the top of the remaining overmold 144 for clarity, it should be understood that any exposed portions of the first wire 114, the second wire 116, and the fourth wire 120 may be flush with the top of the remaining overmold 144 in various embodiments. In some embodiments, the process of removing the top portion 200 of the overmold 144 may also remove a portion of the first wire 114, the second wire 116, and/or the fourth wire 120, but may still allow probes to be landed to these bond wires, which may act as surface probe points on the top of the newly grinded package. In various embodiments, all critical components and connections within the IC package assembly 100 may be left undisturbed by removal of the top portion 200 of the overmold 144.

Figure 3:
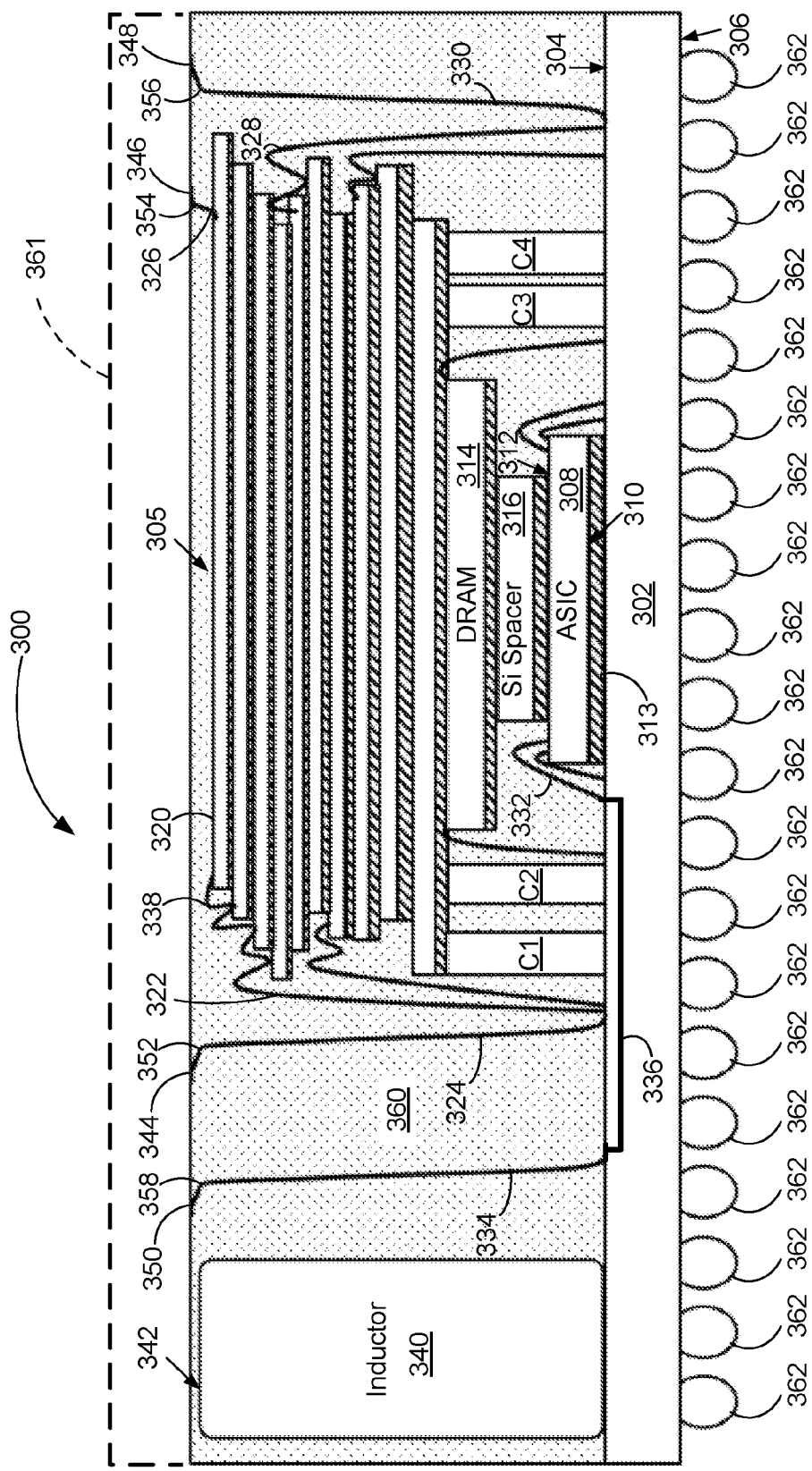
FIG. 3 schematically illustrates a cross-sectional side view of another IC package assembly that may include one or more wires extending beyond a topmost component in the IC package assembly and having a top portion removed to expose one or more wires, in accordance with various embodiments.

FIG. 3 schematically illustrates a cross-sectional side view of an IC package assembly 300, in accordance with some embodiments. In various embodiments, the IC package assembly 300 may include a substrate 302 having a first side 304 and a second side 306 opposite the first side 304. In some embodiments, the substrate 302 may include a redistribution layer, not shown for clarity, similar to the redistribution layer 107 described with respect to FIG. 1. In various embodiments, the substrate 302 may include one or more additional layers. In some embodiments, the IC package assembly 300 may also include an IC die stack 305 that may include a first IC die 308 having a first side 310 and a second side 312 opposite the first side 310, where the first side 310 of the first IC die 308 faces the first side 304 of the substrate 302. In various embodiments, the first IC die 308 may be an application specific integrated circuit (ASIC) die. In some embodiments, a die attach layer 313 may be between the first IC die 308 and the substrate 302. In various embodiments, the die attach layer 313 may be an adhesive and/or an insulator. In some embodiments, the die attach layer 313 may not be present and the first IC die 308 may be directly coupled with the substrate 302.

In some embodiments, the IC die stack 305 may include a second IC die 314. In various embodiments, the second IC die 314 may be a dynamic random access memory (DRAM) die. The IC package assembly 300 may include a silicon (Si) spacer 316 that may be between the first IC die 308 and the second IC die 314 in some embodiments. In various embodiments, the IC die stack 305 may include a third IC die 320. As shown, the third IC die 320 may be the topmost die in the IC package assembly 300 in some embodiments. In some embodiments, the topmost die may be the topmost component in the IC package assembly 300. In other embodiments, some other type of component having a surface located farthest from the substrate 302 may be the topmost component. In various embodiments, the IC die stack 305 may include one or more additional IC dies, not labeled for clarity. In some embodiments, one or more additional die attach layers, not labeled for clarity, may be located between one or more of the IC dies or other components in the IC die stack 305.

In various embodiments, a first wire 322 may be wire bonded to the substrate 302 and the third IC die 320, a second wire 324 may be electrically coupled with the first wire 322 at the substrate 302, a third wire 326 may be electrically coupled with the third IC die 320, a fourth wire 328 may be electrically coupled with one or more IC dies in the IC die stack 305 and the substrate 302, a fifth wire 330 may be electrically coupled with the fourth wire 328 at the substrate 302, a sixth wire 332 may be electrically coupled with the first IC die 308 and the substrate 302, and a seventh wire 334 may be electrically coupled with the substrate 302. In some embodiments, a conductive feature 336 (e.g., a metal trace) may electrically couple the sixth wire 332 and the seventh wire 334. In various embodiments, an eighth wire, not shown for clarity, may be electrically coupled with the sixth wire 332, the seventh wire 334, the conductive feature 336, and the third IC die 320. In some embodiments, the eighth wire may have an end that extends upward beyond a topmost component in the IC package assembly 300.

In various embodiments, the conductive feature 336 may electrically couple a different pair or set of wires or features, and/or more than one conductive feature 336 may be included. For example, in some embodiments, the conductive feature 336 may electrically couple a wire from the second IC die 314 to a wire having an end that extends upward beyond a topmost component in the IC package assembly. In various embodiments, the conductive feature 336 may extend along the substrate 302 such that a portion of the conductive feature 336 is under one or more IC dies of the IC package assembly 300 and a portion of the conductive feature 336 is not under any IC dies of the IC package assembly 300, such that the conductive feature 336 may thereby assist in providing access to one or more signals that would have otherwise been buried under one or more IC dies.

In various embodiments, the first wire 322 may include a highest point 338 between the third IC die 320 and a lower layer such as the substrate 302 and/or lower layers in the IC die stack 318. In some embodiments, the highest point 338 may be the highest point of any portions of wires extending between an IC die in the IC die stack 305 and a lower layer in the IC die stack 305 and/or the substrate 302.

In various embodiments, the IC package assembly 300 may include a passive component such as an inductor 340 that may have a top surface 342. In some embodiments, the IC package assembly 300 may include one or more components under a portion of the IC die stack 305 such as capacitors C1, C2, C3, and C4. In some embodiments, the third wire 326 may not be electrically coupled with lower layers of the IC die stack 305 or the substrate 302. In various embodiments, an end 344 of the second wire 324, an end 346 of the third wire 326, an end 348 of the fifth wire 330, and an end 350 of the seventh wire 334 may extend upward above the topmost die (e.g., third IC die 320), the highest point of any wires coupled with lower layers (e.g., highest point 338), and the top of other components in the IC package assembly 300 (e.g., top surface 342 of inductor 340). In IC package assembly 300, the inductor 340 is shown as the topmost component. In embodiments, the relative directions upward and/or above may refer to a direction from the first side 310 to the second side 312 of the die 308 away from the substrate 302, although it should be understood that the overall orientation of the IC package assembly 300 may be in any direction with respect to another reference frame such as an earth centered coordinate system. In some embodiments, the end 350 of the seventh wire 334 and the end of the eighth wire may allow for testing and visibility of waveforms relating to electrically connected elements that may look different depending on which die (e.g., first IC die 308, third IC die 320) and the location of the probe (e.g., end 350 of seventh wire 334 or end of eighth wire). In various embodiments, the second wire 324, the third wire 326, the fifth wire 330, and the seventh wire 334 may be testing wires. In some embodiments, the first wire 322, the fourth wire 328, and the sixth wire 332 may not be testing wires. In various embodiments, testing wires in the IC package assembly 300 may extend beyond a topmost component in the IC package assembly 300 and/or beyond the highest point of any non-testing wires. In some embodiments where wires may be considered to be components in the IC package assembly 300, the topmost component may be the component in the IC package assembly 300 having a surface located the farthest from the substrate 302 of any components other than testing wires in the IC package assembly 300 such that the testing wires may extend above the highest point of non-testing wires and/or components such as dies and/or inductors.

In some embodiments, the second wire 324 may be bent at a position 352, the third wire 326 may be bent at a position 354, the fifth wire 330 may be bent at a position 356, and the seventh wire 334 may be bent at a position 358. In embodiments, the wires may be bent in a horizontal direction relative to the upward direction from the substrate 302 toward a top of the IC package assembly 300. In various embodiments, the positions 352, 354, 356, and 358 may be above the topmost die 320, and in some embodiments, the positions 352, 354, 356, and/or 358 may be above the topmost component in the IC package assembly 300 (e.g., top surface 342 of inductor 340). In some embodiments, one of more of the wires may be bent at a position that starts lower than one or more of the topmost die or the topmost component in the IC package assembly 300, but the ends of the wires (e.g., 344, 346, 348, 350) may still be above the topmost die and the topmost component in the IC package assembly 300. In various embodiments, the length of the bond wires extending beyond the topmost component may be short enough such that the stubs are electrically insignificant to the signal integrity of the interface, and a power net may not be impacted by the longer length of bond wire coupled with a substrate contact point. In some embodiments, for more sensitive I/O signals, the bond wire extension may be designed to connect to the topmost silicon package in a stacked die configuration to minimize the length to the package surface.

In various embodiments, an encapsulating cover 360 may encapsulate the IC die stack 305, the inductor 340, the capacitors C1, C2, C3, C4, and the wires in the IC package assembly 300. In some embodiments, the encapsulating cover 360 may be an overmold and/or formed of a molding material. In FIG. 3, the IC package assembly 300 is shown after a portion 361 of the encapsulating cover 360 has been removed, such as by using a grinding or sanding process. In various embodiments, the ends of the wires may extend above the topmost component and the highest point of portions of wires coupled with lower layers so the ends of the wires are exposed for testing when the portion 361 of the encapsulating cover 360 is removed. In some embodiments, extending the ends of the wires above the topmost component may provide an increase in signal accessibility, allowing more thorough characterization of the electrical performance within the package. By removing the complex etching process, some embodiments may have a significant impact on reducing test throughput times and/or may minimize testing sample size requirements that rely on functional testing.

In various embodiments, the IC package assembly 300 may include one or more interconnects 362, that may be solder balls or other interconnect structures in some embodiments. In embodiments, the interconnects 362 may be electrically coupled with one or more pads on the first side 304 of the substrate 302 such as by using connecting structures (e.g., vias) between the interconnects 362 and the first side 304. The pads and connecting structures are not shown in FIG. 3 for clarity. In embodiments, one or more wires electrically coupled with one or more dies in the IC die stack 305 and the substrate 302 may be electrically coupled with one or more of the one or more interconnects 362. In some embodiments, other aspects discussed with respect to the IC package assembly 100 of FIG. 1 may also apply to the IC package assembly 300 of FIG. 3. In various embodiments, IC package assemblies such as the IC package assembly 100 or the IC package assembly 300 may be applied to a wide range of IC packages, such as from a simple NAND package with a single silicon die to a highly integrated System in Package that may include active voltage regulators and multiple stacked silicon die. In some embodiments, the IC package assembly 300 may be a solid state drive (SSD), include an SSD, or be a component of an SSD.

Figure 4:
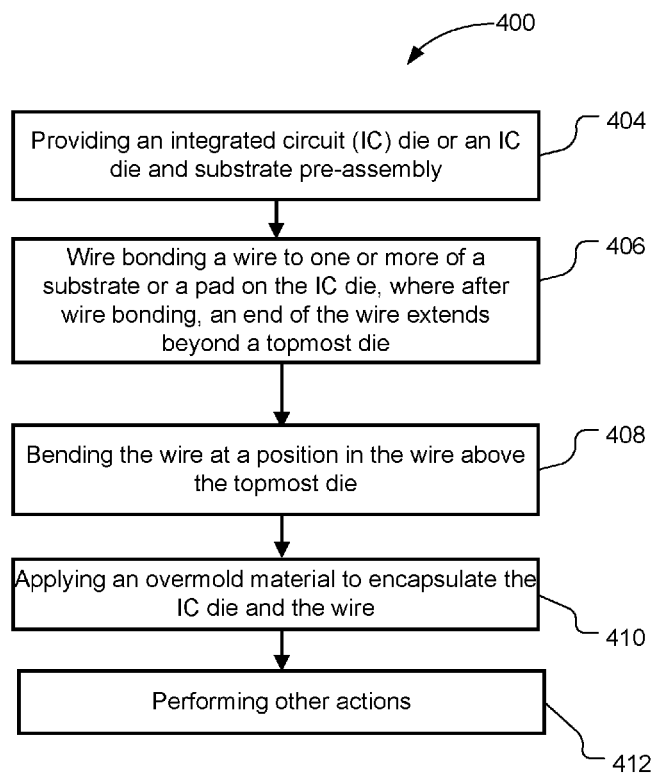
FIG. 4 schematically illustrates a flow diagram for a process of fabricating an IC package assembly such as one or more of the IC package assemblies of FIGS. 1-3, in accordance with various embodiments.

FIG. 4 schematically illustrates a flow diagram for a process 400 of fabricating an IC package assembly such as the IC package assembly 100 of FIG. 1 and/or the IC package assembly 300 of FIG. 2, in accordance with various embodiments. At a block 404, the process 400 may include providing an IC die (e.g., IC die 108) or an IC die and substrate pre-assembly. In some embodiments, one or more additional IC die may also be provided at the block 404 in various embodiments. In some embodiments, the process 400 may include mounting the IC die to a substrate.

The process may continue at a block 406 with wire bonding a wire to one or more of a substrate or a pad on the IC die, where after wire bonding, an end of the wire extends beyond a topmost component in the IC package. In some embodiments, the process 400 may continue at a block 408 with bending the wire at a position in the wire above the topmost component.

The process 400 may continue at a block 410 with applying an overmold material to encapsulate the IC die and the wire. At a block 412, the process 400 may continue at a block 412 with performing other actions. In some embodiments, a portion of the overmold material may be removed at the block 412 to expose one or more ends of the wires for testing.

Figure 5:
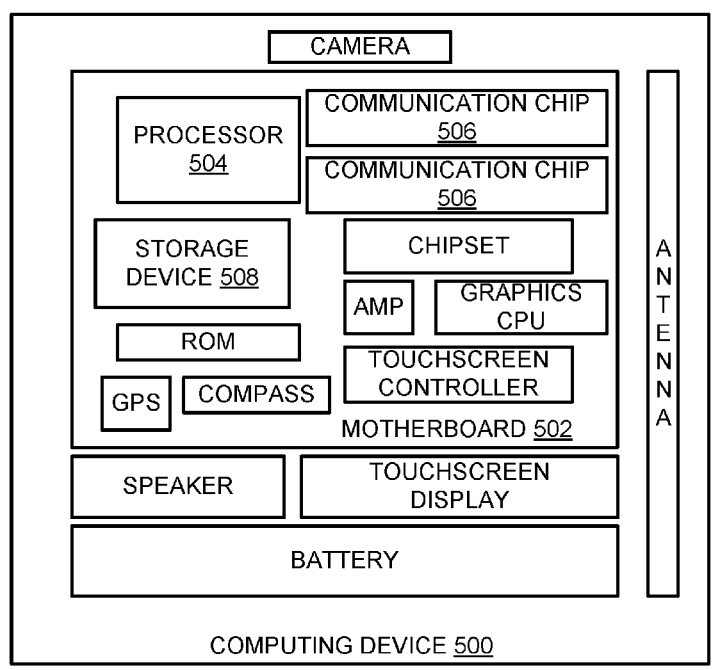
FIG. 5 schematically illustrates a computing device that may include an IC package assembly of one or more of FIGS. 1-3, in accordance with various embodiments.

Embodiments of the present disclosure may be implemented into a system using the packages and manufacturing techniques disclosed herein. FIG. 5 schematically illustrates a computing device 500, in accordance with some implementations, which may include one or more IC package assemblies, such as the IC package assembly 100 of FIG. 1 or the IC package assembly 300 of FIG. 3 before the portion 361 is removed, that includes a wire extending above a topmost component in the IC package assembly. In various embodiments, the IC package assembly may be fabricated such that it can be used in the computing device 500 when the ends of the wires are not exposed by removing a portion of the overmold (e.g., overmold 144, encapsulating cover 360), or can be used in a testing environment by removing a portion of the overmold (e.g., 200, 361) to expose the ends of the wires.

The computing device 500 may be, for example, a mobile communication device or a desktop or rack-based computing device. The computing device 500 may house a board such as a motherboard 502. The motherboard 502 may include a number of components, including (but not limited to) a processor 504 and at least one communication chip 506. Any of the components discussed herein with reference to the computing device 500 may include an IC package assembly such as the IC package assembly 100 or the IC package assembly 300 that may include one or more wires extending above a topmost component. In further implementations, the communication chip 506 may be part of a multi-die package such as that described with respect to the IC package assembly 300 of FIG. 3.

The computing device 500 may include a storage device 508. In some embodiments, the storage device 508 may include one or more solid state drives. Examples of storage devices that may be included in the storage device 508 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 500 may include other components that may or may not be physically and electrically coupled to the motherboard 502. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 506 and the antenna may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, EV-DO, and others. In some embodiments, the communication chip 506 may support wired communications. For example, the computing device 500 may include one or more wired servers.

The processor 504 and/or the communication chip 506 of the computing device 500 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory. In various embodiments, a processor may include a single core or multiple cores.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The following paragraphs provide examples of various ones of the embodiments disclosed herein.

Example 1 may include an integrated circuit (IC) package assembly comprising: a substrate having a first side and a second side opposite the first side; an IC die having a first side and a second side opposite the first side, wherein the first side of the IC die faces the first side of the substrate; and a wire electrically coupled with the IC die, wherein an end of the wire extends beyond a topmost component in the IC package assembly, to provide electrical access to circuitry residing in the IC package assembly, wherein the topmost component is the component in the IC package assembly having a surface located the farthest from the substrate of any components other than testing wires in the IC package assembly.

Example 2 may include the subject matter of Example 1, further comprising an overmold coupled with the topmost component.

Example 3 may include the subject matter of any one of Examples 1-2, wherein the topmost component is the IC die.

Example 4 may include the subject matter of any one of Examples 1-3, wherein the IC die is a first IC die, the wire is a first wire, and the IC package assembly further comprises: a second IC die between the first IC die and the substrate; and a second wire electrically coupled with the second IC die, wherein an end of the second wire extends beyond the topmost component in the IC package assembly.

Example 5 may include the subject matter of any one of Examples 1-3, wherein a portion of the wire is bonded to a pad on the IC die.

Example 6 may include the subject matter of any one of Examples 1-3, wherein a portion of the wire is bonded to the substrate.

Example 7 may include the subject matter of Example 6, wherein the substrate includes a redistribution layer and the portion of the wire is bonded to the redistribution layer.

Example 8 may include the subject matter of Example 7, wherein the IC die is a first IC die, the wire is a first wire, the redistribution layer includes one or more electrically conductive elements, and the IC package assembly further comprises: a second IC die between the first IC die and the substrate; a second wire having a first end bonded to a pad on the second IC die and a second end bonded to an electrically conductive element on the redistribution layer at a location under the first IC die, wherein the electrically conductive element extends along the substrate such that a portion of the electrically conductive element is under the first IC die and a portion of the electrically conductive element is not under the first IC die; and a third wire having a first end bonded to the electrically conductive element at a location that is not under the first IC die, and a second end that extends beyond the topmost component in the IC package assembly.

Example 9 may include the subject matter of Example 8, wherein the second IC die is a dynamic random access memory (DRAM) die.

Example 10 may include the subject matter of any one of Examples 1-3, wherein the wire is electrically coupled with a conductive element of the IC die that is not electrically coupled with the substrate.

Example 11 may include a method of fabricating an integrated circuit (IC) package assembly, the method comprising: providing an IC die; and wire bonding a wire to one or more of a substrate or a pad on the IC die, wherein after wire bonding, an end of the wire extends beyond a topmost component in the IC package assembly, wherein the topmost component is the component in the IC package assembly having a surface located the farthest from the substrate of any components other than testing wires in the IC package assembly.

Example 12 may include the subject matter of Example 11, further comprising applying an overmold material to encapsulate the IC die and the wire.

Example 13 may include the subject matter of any one of Examples 11-12, further comprising bending the wire at a position in the wire above the topmost component.

Example 14 may include the subject matter of any one of Examples 11-13, wherein the IC die is a first IC die, the wire is a first wire, and the method further comprises: providing a second IC die to be located between the first IC die and the substrate; and wire bonding a second wire to one or more of the substrate or a pad on the second IC die, wherein after wire bonding, an end of the second wire extends beyond the topmost component in the IC package assembly.

Example 15 may include the subject matter of any one of Examples 11-13, wherein wire bonding the wire includes wire bonding a portion of the wire to a pad on the IC die.

Example 16 may include the subject matter of any one of Examples 11-13, wherein wire bonding the wire includes wire bonding a portion of the wire to the substrate.

Example 17 may include the subject matter of Example 16, wherein the substrate includes a redistribution layer and the wire bonding the wire includes wire bonding the portion of the wire to the redistribution layer.

Example 18 may include the subject matter of Example 17, wherein the IC die is a first IC die, the wire is a first wire, the redistribution layer includes one or more electrically conductive elements, and the method further comprises: providing a second IC die to be located between the first IC die and the substrate; wire bonding a second wire to a pad on the second IC die and to an electrically conductive element on the redistribution layer at a location under the first die, wherein the electrically conductive element extends along the substrate such that a portion of the electrically conductive element is under the first IC die and a portion of the electrically conductive element is not under the first IC die; and wire bonding a first end of a third wire to the electrically conductive element at a location that is not under the first IC die, wherein after wire bonding the third wire, a second end of the third wire extends beyond the topmost component in the IC package assembly.

Example 19 may include a computing device comprising: a circuit board; and an integrated circuit (IC) package assembly coupled with the circuit board, the IC package assembly including: a substrate having a first side and a second side opposite the first side; an IC die having a first side and a second side opposite the first side, wherein the first side of the IC die faces the first side of the substrate; a wire electrically coupled with the IC die, wherein an end of the wire extends beyond a topmost component in the IC package assembly, wherein the topmost component is the component in the IC package assembly having a surface located the farthest from the substrate of any components other than testing wires in the IC package assembly; and an overmold coupled with the topmost component.

Example 20 may include the subject matter of Example 19, wherein the wire is bent at a position in the wire above the topmost component.

Example 21 may include the subject matter of any one of Examples 19-20, wherein a portion of the wire is bonded to a pad on the IC die.

Example 22 may include the subject matter of any one of Examples 19-21, wherein a portion of the wire is bonded to the substrate.

Example 23 may include the subject matter of Example 22, wherein the substrate includes a redistribution layer and the portion of the wire is bonded to the redistribution layer.

Example 24 may include the subject matter of any one of Examples 19-23, wherein the IC die is a memory die and the computing device is a solid state drive (SSD).

Example 25 may include the subject matter of any one of Examples 19-23, wherein the computing device is a mobile computing device including, coupled with the circuit board, a display, a touchscreen display, a touchscreen controller, a battery, a global positioning system device, a compass, a speaker, or a camera.

What is claimed is:

1. An integrated circuit (IC) package assembly comprising:
   a substrate having a first side and a second side opposite the first side;
   an IC die having a first side and a second side opposite the first side, wherein the first side of the IC die faces the first side of the substrate; and
   a wire electrically coupled with the IC die, wherein an end of the wire extends beyond a topmost component in the IC package assembly, to provide electrical access to circuitry residing in the IC package assembly, wherein the topmost component is a component in the IC package assembly having a surface located the farthest from the substrate of any components other than one or more testing wires in the IC package assembly, wherein the wire is one of the one or more testing wires.

2. The IC package assembly of claim 1, further comprising an overmold coupled with the topmost component.

3. The IC package assembly of claim 2, wherein the topmost component is the IC die.

4. The IC package assembly of claim 2, wherein the IC die is a first IC die, the wire is a first wire, and the IC package assembly further comprises:
   a second IC die between the first IC die and the substrate; and
   a second wire electrically coupled with the second IC die, wherein an end of the second wire extends beyond the topmost component in the IC package assembly.

5. The IC package assembly of claim 2, wherein a portion of the wire is bonded to a pad on the IC die.

6. The IC package assembly of claim 2, wherein a portion of the wire is bonded to the substrate.

7. The IC package assembly of claim 6, wherein the substrate includes a redistribution layer and the portion of the wire is bonded to the redistribution layer.

8. The IC package assembly of claim 7, wherein the IC die is a first IC die, the wire is a first wire, the redistribution layer includes one or more electrically conductive elements, and the IC package assembly further comprises:
   a second IC die between the first IC die and the substrate;
   a second wire having a first end bonded to a pad on the second IC die and a second end bonded to an electrically conductive element on the redistribution layer at a location under the first IC die, wherein the electrically conductive element extends along the substrate such that a portion of the electrically conductive element is under the first IC die and a portion of the electrically conductive element is not under the first IC die; and
   a third wire having a first end bonded to the electrically conductive element at a location that is not under the first IC die, and a second end that extends beyond the topmost component in the IC package assembly.

9. The IC package assembly of claim 8, wherein the second IC die is a dynamic random access memory (DRAM) die.

10. The IC package assembly of claim 2, wherein the wire is electrically coupled with a conductive element of the IC die that is not electrically coupled with the substrate.

11. A method of fabricating an integrated circuit (IC) package assembly, the method comprising:
    providing an IC die; and
    wire bonding a wire to one or more of a substrate or a pad on the IC die, wherein after wire bonding, an end of the wire extends beyond a topmost component in the IC package assembly, wherein the topmost component is a component in the IC package assembly having a surface located the farthest from the substrate of any components other than one or more testing wires in the IC package assembly, wherein the wire is one of the one or more testing wires.

12. The method of claim 11, further comprising applying an overmold material to encapsulate the IC die and the wire.

13. The method of claim 12, further comprising bending the wire at a position in the wire above the topmost component.

14. The method of claim 12, wherein the IC die is a first IC die, the wire is a first wire, and the method further comprises:
    providing a second IC die to be located between the first IC die and the substrate; and wire bonding a second wire to one or more of the substrate or a pad on the second IC die, wherein after wire bonding, an end of the second wire extends beyond the topmost component in the IC package assembly.

15. The method of claim 12, wherein wire bonding the wire includes wire bonding a portion of the wire to a pad on the IC die.

16. The method of claim 12, wherein wire bonding the wire includes wire bonding a portion of the wire to the substrate.

17. The method of claim 16, wherein the substrate includes a redistribution layer and the wire bonding the wire includes wire bonding the portion of the wire to the redistribution layer.

18. The method of claim 17, wherein the IC die is a first IC die, the wire is a first wire, the redistribution layer includes one or more electrically conductive elements, and the method further comprises:
providing a second IC die to be located between the first IC die and the substrate;
wire bonding a second wire to a pad on the second IC die and to an electrically conductive element on the redistribution layer at a location under the first IC die, wherein the electrically conductive element extends along the substrate such that a portion of the electrically conductive element is under the first IC die and a portion of the electrically conductive element is not under the first IC die; and
wire bonding a first end of a third wire to the electrically conductive element at a location that is not under the first IC die, wherein after wire bonding the third wire, a second end of the third wire extends beyond the topmost component in the IC package assembly.

19. A computing device comprising:
a circuit board; and
an integrated circuit (IC) package assembly coupled with the circuit board, the IC package assembly including:
a substrate having a first side and a second side opposite the first side;
an IC die having a first side and a second side opposite the first side, wherein the first side of the IC die faces the first side of the substrate;
a wire electrically coupled with the IC die, wherein an end of the wire extends beyond a topmost component in the IC package assembly, wherein the topmost component is a component in the IC package assembly having a surface located the farthest from the substrate of any components other than one or more testing wires in the IC package assembly, wherein the wire is one of the one or more testing wires; and
an overmold coupled with the topmost component.

20. The computing device of claim 19, wherein the wire is bent at a position in the wire above the topmost component.

21. The computing device of claim 19, wherein a portion of the wire is bonded to a pad on the IC die.

22. The computing device of claim 19, wherein a portion of the wire is bonded to the substrate.

23. The computing device of claim 22, wherein the substrate includes a redistribution layer and the portion of the wire is bonded to the redistribution layer.

24. The computing device of claim 19, wherein the IC die is a memory die and the computing device is a solid state drive (SSD).

25. The computing device of claim 19, wherein the computing device is a mobile computing device including, coupled with the circuit board, a display, a touchscreen display, a touchscreen controller, a battery, a global positioning system device, a compass, a speaker, or a camera.

* * * * *